(12) United States Patent
Chou

(10) Patent No.: US 6,828,244 B2
(45) Date of Patent: Dec. 7, 2004

(54) METHOD AND APPARATUS FOR HIGH DENSITY NANOSTRUCTURES

(75) Inventor: Stephen Y. Chou, Princeton, NJ (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/301,475

(22) Filed: Nov. 21, 2002

(65) Prior Publication Data

US 2003/0170995 A1 Sep. 11, 2003

Related U.S. Application Data

(63) Continuation of application No. 09/430,602, filed on Oct. 29, 1999, now Pat. No. 6,518,189, which is a continuation-in-part of application No. 09/107,006, filed on Jun. 30, 1998, now Pat. No. 6,309,580, which is a continuation-in-part of application No. 08/558,809, filed on Nov. 15, 1995, now Pat. No. 5,772,905.

(60) Provisional application No. 60/106,475, filed on Oct. 30, 1998.

(51) Int. Cl.$^7$ ............................................ H01L 21/302
(52) U.S. Cl. ................... 438/706; 438/708; 438/711; 438/720; 438/725
(58) Field of Search ............................... 438/706, 708, 438/711, 720, 725

(56) References Cited

U.S. PATENT DOCUMENTS

| | | |
|---|---|---|
| 4,287,235 A | 9/1981 | Flanders |
| 4,512,848 A | 4/1985 | Deckman et al. |
| 4,543,225 A | 9/1985 | Beaujean |
| 5,259,926 A | 11/1993 | Kuwabara et al. |
| 5,338,396 A | 8/1994 | Abdala et al. |
| 5,425,848 A | 6/1995 | Haisma et al. |
| 5,434,107 A | 7/1995 | Paranjpe |
| 5,471,455 A | 11/1995 | Jabr |
| 5,503,963 A * | 4/1996 | Bifano .................. 430/321 |
| 5,638,355 A * | 6/1997 | Jabr .................. 369/275.4 |

OTHER PUBLICATIONS

Kamins, T.I., "Positioning of Self–Assembled, single–crystal, germanium islands by silicon nanoimprinting" Applied Physics Letter, vol. 74, No. 12, Mar. 22, 1999.

Wang, J., et al., "Fabricationr of a new broadband waveguide polarizer with a double–layer 190 nm period metal–gratings using nanoimprint lithography" J. Vac. Sci. Technol. B 17(6) Nov/Dec 1999.

Tan, H., et al., "Roller Nanoimprint Lithograph" Vac. Sci. Technol. B 16(6) Nov/Dec 1998.

Feynman, Richard, "There's Plenty of Room at the Bottom–An Invitation to Enter a New Field of Physics" talk delivered at the annual meeting of the American Physical SOciety at the California Institute of Technology (Caltech) in 1959, published in Feb. 1960 Issue of Caltech's "Engineering and Science".

(List continued on next page.)

Primary Examiner—Nadine G. Norton
Assistant Examiner—Binh X. Tran
(74) Attorney, Agent, or Firm—Lowenstein Sandler P.C.

(57) ABSTRACT

A method and apparatus for high density nanostructures is provided. The method and apparatus include Nano-compact optical disks, such as nano-compact disks (Nano-CDS). In one embodiment a 400 Gbit/in$^2$ topographical bit density nano-CD with nearly three orders of magnitude higher than commercial CDS has been fabricated using nanoimprint lithography. The reading and wearing of such Nano-CDS have been studied using scanning proximal probe methods. Using a tapping mode, a Nano-CD was read 1000 times without any detectable degradation of the disk or the silicon probe tip. In accelerated wear tests with a contact mode, the damage threshold was found to be 19 $\mu$N. This indicates that in a tapping mode, both the Nano-CD and silicon probe tip should have a lifetime that is at least four orders of magnitude longer than that at the damage threshold.

3 Claims, 4 Drawing Sheets

OTHER PUBLICATIONS

Flanders, D.C., "X–ray Lithography at ~ 100 A linewidths using z–ray masks fabricated by shadowing techniques–"Journal of Vacuum Science and Technology, 16 (6), Nov/Dec 1979 (received Jun. 11, 1979), pp. 1615 to 1619, published American Vacuum Society, USA.

Jorritsma et al., "Fabrication of large arrays of metalic nanowires on V–grooved substrates" Applied Physics Letters 67(10), Sep. 4, 1995 (received May 16, 1995), pp. 1489–1491, published by American Institute of Physics, USA.

Aumiller et al., "Submicrometer Resolution Replication of Relief Patterns for Integrated Optics", J. Appl. Phys., vol. 45, pp. 4557–4562, (1974).

Nisper, "Injection–molded replication if binary optic structures", SPE v2600 Oct 23–24, 1995 p. 56–64 0227–786X.

Shvartsman, "Holographic optical elements by dry photopolymer embossing" SPIE (1991) 1461 (pract. Holog.S) pp. 313–320.

"Fabrication of submicron crossed square wave grating by dry etching and thermoplastic replication techniques" JVST B vol. 1, No. 4, Dec 1983 pp. 1207–1210.

Healey et al., "Photodeposition of Micrometer–scale polymer patterns on optical imaging Fibers" Science vol. 269, No. 25, Aug. 1995, pp. 1078–1080.

* cited by examiner

FIG. 2
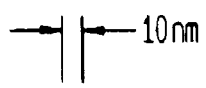
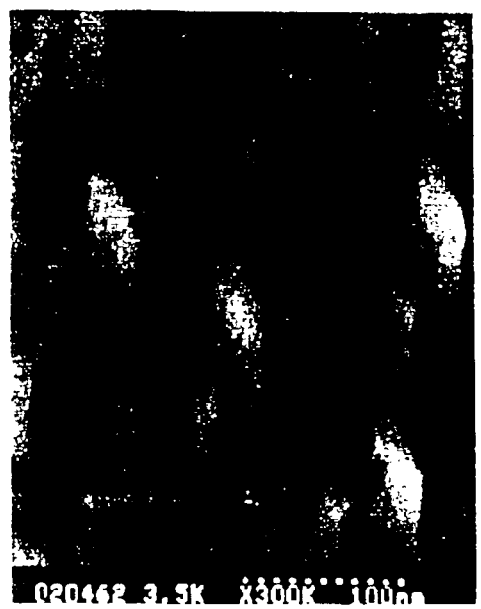
FIG. 3

INITIAL TMAFM IMAGE OF 50 nm PERIOD NANO-CD

TMAFM IMAGE AFTER 1000 SCANS OF NANO-CD

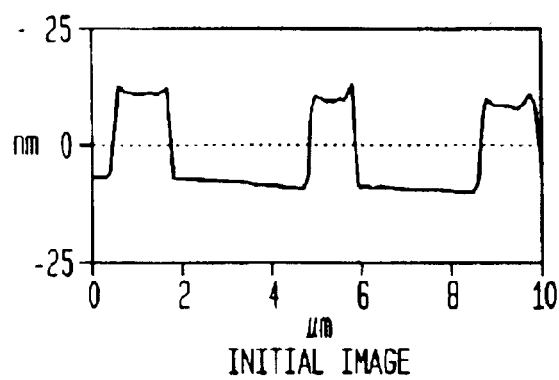
FIG. 6A INITIAL IMAGE
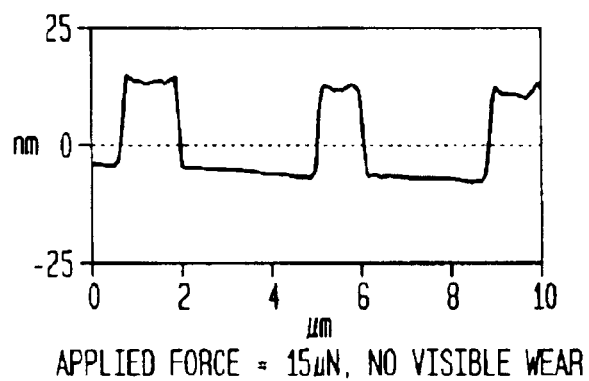
FIG. 6B APPLIED FORCE = 15μN, NO VISIBLE WEAR
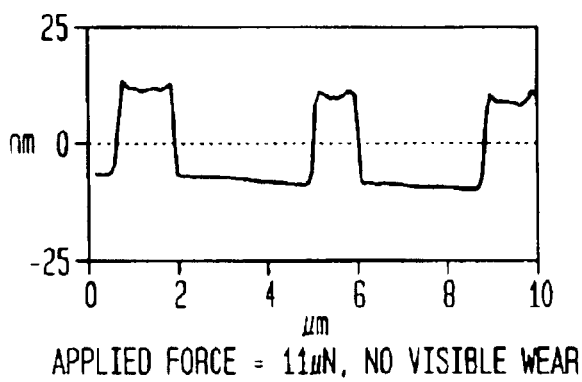
FIG. 6C APPLIED FORCE = 11μN, NO VISIBLE WEAR
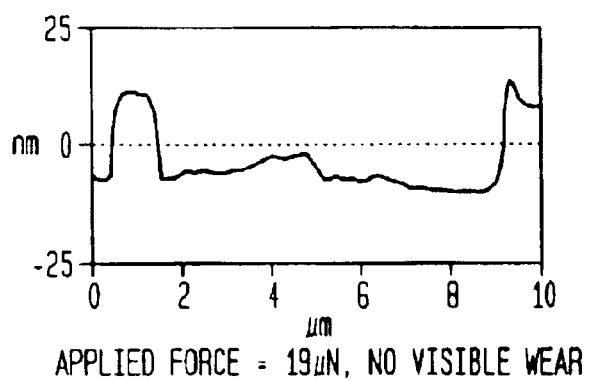
FIG. 6D APPLIED FORCE = 19μN, NO VISIBLE WEAR

METHOD AND APPARATUS FOR HIGH DENSITY NANOSTRUCTURES

CROSS REFERENCE TO RELATED APPLICATIONS

This application is a continuation of U.S. patent application Ser. No. 09/430,602 filed Oct. 29, 1999 now U.S. Pat. No. 6,518,189 which is a continuation-in-part of U.S. patent application Ser. No. 09/107,006 filed on Jun. 30, 1998, (now U.S. Pat. No. 6,309,580 issued Oct. 30, 2001) and also claims the benefit of U.S. Provisional Application Ser. No. 60/106,475 filed on Oct. 30, 1998, which is incorporated herein by reference. Ser. No. 09/107,006 in turn, is a continuation-in-part of U.S. patent application Ser. No. 08/558,809 filed Nov. 15, 1995 (now U.S. Pat. No. 5,772,905 issued Jun. 30, 1998.

This invention was made with government support under Department of the Navy, Grant Nos. N00014-96-1-1116 and N00014-96-1-0787. The government has certain rights in the invention

FIELD OF THE INVENTION

The present disclosure relates generally to fabrication of nanostructures and in particular to high density nanostructure fabrication using nanoimprint lithography.

BACKGROUND OF THE INVENTION

Nanostructures are used for a variety of application areas, including, among other things, optical and magnetic data storage. One form of data storage is a low-cost information storage media known as Read Only Memory (ROM). One way to make ROM disks is by injection molding. Such disks may have a data storage density of ~0.68 $Gbit/in^2$, and are read using a focused laser beam. To meet the future demand for ROM disks with increasing information storage densities, methods must be developed for low-cost manufacturing of such disks with replicated data patterns, and for inexpensive read-back techniques suitable for retrieving high-density information.

One attempt is to develop ROM disks with ultrahigh-density topographical bits and to use proximal-probe based read-back. ROM disks of topographic bits with 45 $Gbit/in^2$ storage density have recently been reported by a group from IBM (B. D. Terris, H. J. Mamin, and D. Rugar, 1996 EIPBN, Atlanta, Ga., 1996; B. D. Terris, H. J. Mamin, M. E. Best, J. A. Logan, D. Rugar, and S. A. Righton, *Apply. Phys. Lett.*, 69, 4262 (1996)). This group reports that features as small as 50 nm were produced by electron beam lithography and replicated on a glass substrate using a photopolymerization (2P) process. However, a smaller the feature size is needed to increase the storage density of the medium.

What is needed in the art is an improved method and apparatus for high density nanostructures. There is also a need for smaller feature size storage to enhance storage density.

SUMMARY OF THE INVENTION

The present disclosure teaches methods and apparatus which address the needs in the art mentioned above and addresses several other needs not mentioned expressly herein, but appreciated by those skilled in the art.

Method and apparatus for producing nanostructures is provided. The nanostructures are useful in the production of high density and ultra-high density storage media. The method and apparatus are demonstrated in the application to nano-compact disks, however, the method and apparatus are suitable for other applications, and the nano-compact disk application is not intended in an exclusive or limiting sense.

In particular nano-compact disks with 400 $Gbit/in^2$ storage density containing 10 nm minimum feature sizes have been fabricated using nanoimprint lithography. Furthermore, method and apparatus relating to the reading and wearing of Nano-CDS using scanning proximal probe techniques are described. This storage density is nearly three orders of magnitude higher than commercial CDS (0.68 $Gbit/in^2$). Other embodiments are possible with different feature sizes and different storage densities using the method and apparatus provided herein.

BRIEF DESCRIPTION OF THE DRAWINGS

FIG. 2 is a SEM micrograph of a 50 nm track with Nano-CD daughter mold fabricated using nanoimprint lithography, according to one embodiment of the present system.

FIG. 3 is a SEM micrograph of a 40 nm track width Nano-CD fabricated with nanoimprint lithography and liftoff, according to one embodiment of the present system.

FIG. 6 shows cross sections of contact mode AFM images showing wear of chrome grating after various applied forces using a silicon scanning probe tip, according to one embodiment of the present system. The images are for (a) initial, (b) 11 $\mu N$, (c) 15 $\mu N$, and (d) 19 $\mu N$ applied force. Only at the 19 $\mu N$ force the tip removes the Cr grating.

DETAILED DESCRIPTION OF THE INVENTION

Figure 1:
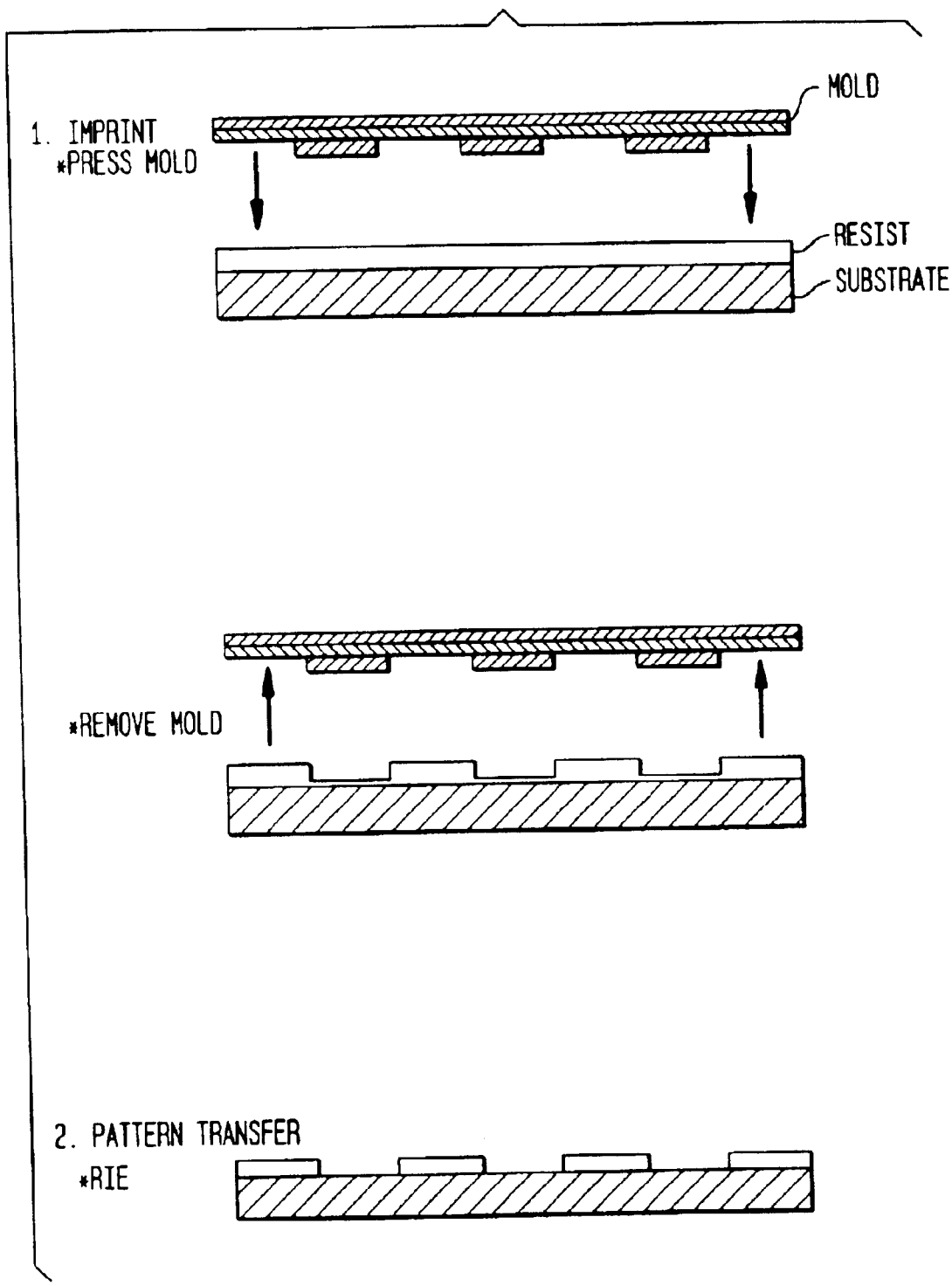
FIG. 1 is a schematic of one nanoimprint lithography process for production of nanostructures according to one embodiment of the present system.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views.

One embodiment of the present system uses a nanostructure fabrication process incorporating nanoimprint lithography (NIL) to create high density storage media, such as optical disks, for example compact disks. Other high density or ultra high density storage formats, such as magnetic, are possible without departing from the scope of the present system.

NIL is a high-throughput and low-cost nonconventional lithography technology with sub-10 nm resolution. One embodiment of the technology is provided in FIG. 1, and is discussed in U.S. Pat. No. 5,772,905 by S. Y. Chou, and the articles by S. Y. Chou, P. R. Krauss, and P. J. Renstrom, in *Applied Physics Letters,* 67, 3114 (1995); and *Science,* 272, 85 (1996), all of which are incorporated herein by reference in their entirety. Other embodiments and applications are described in copending U.S. patent application Ser. No. 09/107,006, entitled Release Surfaces, Particularly for Use in Nanoimprint Lithography, and in U.S Pat. No. 5,820,769, Ser. No. 08/448,807 entitled Method for Making Magnetic Storage Having Discrete Elements With Quantized Magnetic Moments, and copending U.S. patent application Ser. No. 08/762,781, entitled Quantum Magnetic Storage, all of which are incorporated by reference in their entirety. Applicant also incorporates by reference in its entirety the article entitled Nano-compact disks with 400 Gbit/in$^2$ storage density fabricated using nanoimprint lithography and read with proximal probe by P. R. Krauss and S. Y. Chou in *Applied Physics Letters,* 71 (21), 24 Nov. 1997.

In one embodiment, NIL patterns a resist through deformation of resist physical shape by embossing rather than through modification of resist chemical structure by radiation or by self-assembly. The nanoscale topographical bits on a Nano-CD can be made with a variety of materials such as polymers, amorphous materials, crystalline semiconductors, or metals. Here, we focus our discussion on one embodiment of Nano-CDS consisting of metal bits. Other embodiments and applications are possible, and the description herein is not intended in a limiting or exclusive sense.

In this embodiment, the first step of the Nano-CD fabrication process uses a $SiO_2$ mold on a silicon substrate with a CD-like data pattern fabricated using high-resolution electron beam lithography and reactive ion etching. The $SiO_2$ was selected because it has a low atomic number to reduce the backscattering and proximity effects during the electron beam lithography, thereby extending the lithography resolution down to features as small as 10 nm with a 40 nm period, in one embodiment. Other embodiments having different feature sizes are possible without departing from the present system. Although high-resolution electron beam lithography is a relatively expensive and low-throughput process, the master mold may be used to replicate many Nano-CDS using inexpensive and high-throughput NIL. Furthermore, the master mold may be used to fabricate daughter molds, thereby increasing the total number of disks that can be fabricated per master mold, and lowering the cost per disk. The daughter molds may be composed of the same material as the master mold, or other materials (such as high atomic number materials) that are optimized for better durability performance. A daughter mold with 13 nm minimum feature size and 40 nm pitch fabricated using NIL is shown in FIG. 2. Other feature sizes with different minimum feature sizes are possible without departing from the present system.

The second step in the Nano-CD fabrication process, according to this embodiment, was to imprint the mold into a polymer resist film on a disk substrate using NIL. The 75-nm-tall $SiO_2$ master Nano-CD mold was imprinted into a 90-nm-thick polymethyl-methacrylate (PMMA) film on a silicon disk. During the imprint step, both the mold and resist coated disk were heated to 175° C., however, other temperatures are possible without departing from the present system. The mold and wafer were compressed together with a pressure of 4.4 MPa for 10 minutes at this temperature, followed by being cooled down to room temperature. The mold was then separated from the disk resulting in duplication of the Nano-CD data pattern in the PMMA film. A mold release agent, as described in U.S. patent Ser. No. 09/107,006, entitled Release Surfaces, Particularly for Use in Nanoimprint Lithography, which was incorporated by reference in its entirety, may be used to improve the resolution of the imprinting and improve the minimal feature size. Furthermore, it has been demonstrated that using a single molecular layer of release agent or agents may provide a minimal feature size of 10 nanometers or less.

At this point, it is possible to directly use the disk with the patterned PMMA for data read-back, such as done with acrylate-based 2P processes. One advantage of NIL over the 2P process is that it can produce smaller feature sizes. Another advantage is that the substrate choice in NIL is not limited to UV transparent materials such as glass, but can be silicon, aluminum, or other opaque substrates.

Figure 4:
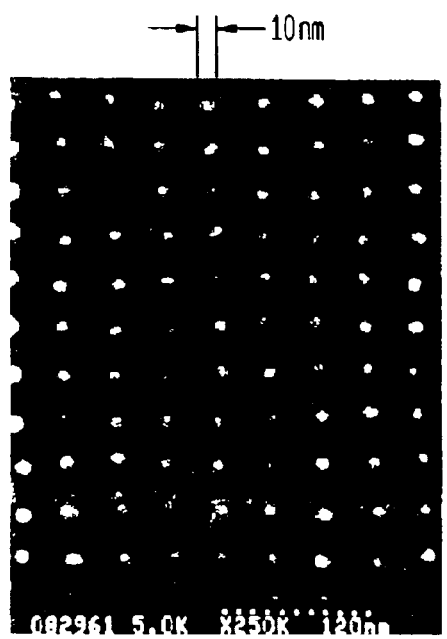
FIG. 4 is a SEM micrograph of a Nano-CD consisting of 10 nm metal dots with a 40 nm period fabricated using nanoimprint lithography and liftoff, according to one embodiment of the present system.

The third step of the Nano-CD fabrication process, according to this embodiment, was to transfer the imprinted pattern into metal bits, which have much better durability than polymers during read-back. An anisotropic $O_2$ RIE pattern transfer step was used to transfer the imprinted pattern through the entire PMMA thickness. The resulting PMMA template was used to transfer the Nano-CD pattern into metal using a liftoff process where Ti/Au (5 nm/10 nm thick) were deposited on the entire disk and lifted off. FIG. 3 shows a section of a Nano-CD with a 40 nm track width and 13 nm minimum feature size, fabricated using the mold shown in FIG. 2. Other minimal feature sizes are possible without departing from the present system. This track width corresponds to a storage density of 400 Gbit/in$^2$. FIG. 4 shows another 400 Gbit/in$^2$ Nano-CD with 10 nm minimum feature size and 40 nm pitch. Gold was chosen due to it high contrast on the silicon substrate in the scanning electron microscopy (SEM). Other materials may also be used which offer better wear properties than gold, as discussed later.

In one embodiment, rather than deposit material on substrate the PMMA can be used as the etch mask to directly etch the substrate.

It is noted that the fabrication process described herein is not intended in an exclusive or limiting sense. Other materials may be used and temperatures and processes may be employed which are within the scope of the present system.

Figure 5A:
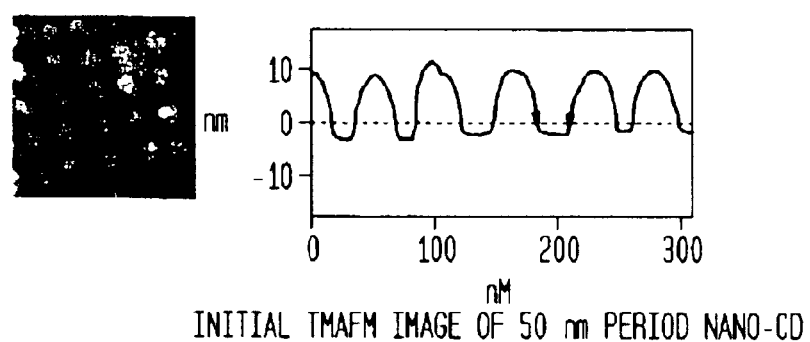
FIG. 5 is an initial tapping mode AFM image (a) and 1000th image (b) of a Nano-CD consisting of 50 nm period gold dots fabricated using nanoimprint lithography and liftoff, according to one embodiment of the present system.
Figure 5B:
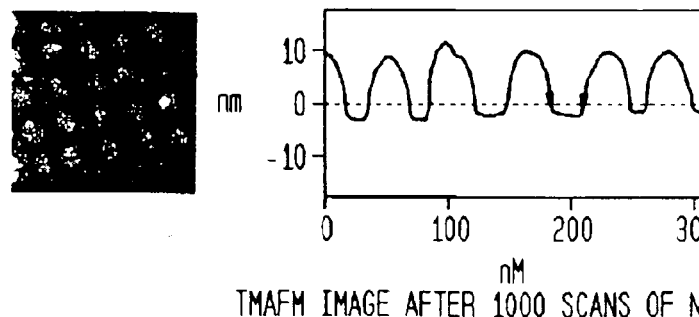

A high-resolution and nondestructive technique is needed to read data stored in the nanoscale topographical bits of a Nano-CD. The bits are too small to be read by current laser beams as used in CDS. In one embodiment, information stored on Nano-CDS was read back using an atomic force microscope (AFM) with commercial silicort scanning probes. Both tapping mode and contact mode AFM were demonstrated. FIG. 5(a) shows a tapping mode AFM image and a cross-section profile of a Nano-CD consisting of a uniform array of gold dots with a 50 nm period. Tapping mode AFM images show the gold dots are wider than the 10 nm measured by SEM. The discrepancy is attributed to the scanning probe's tip size. The cross-section profile indicates that the probe tip can resolve individual nanoscale dots and the flat silicon substrate between the 50 nm period dots. However, for 40 nm period dot arrays with the same diameter, the probe tip could not always reach the substrate, making the dot height measured by AFM smaller than that for 50 nm period dots. This problem can be avoided by using a sharper probe.

The wear of Nano-CDS and the scanning probe during read-back process was investigated. Tapping mode AFM (a force range of 0.1–1.0 nano-Newtons) was used to scan the same location of the Nano-CD 1000 times as shown in FIG.

5(b). We did not observe any discernible change in the AFM image. This indicates that neither the silicon proximal probe nor the Nano-CD exhibited significant wear during the tapping mode AFM imaging.

To accelerate the wear test of the tips and the disks, contact mold AFM and large tip forces were used. Moreover, the gold dots were replaced by a 15-nm-thick chrome grating of a 3 µm spacing and linewidth fabricated using photolithography and liftoff. Chrome has a Mohs hardness of 9, making it more resistant to wear than gold, which has a hardness of 2.5. The magnitude of the applied forces depends upon the spring constant of the proximal probe cantilever. The AFM tips used were 125-µm-long commercial silicon cantilevers which had spring constants ranging from 20 to 100 N/m. Since the spring constant of the cantilevers was not accurately known, the approximate forces were calculated using a spring constant of 60 N/m.

FIG. 6 shows 10-µm-wide cross-section profiles from contact mode AFM images of the chrome grating after various forces were applied to the center 5-µm-wide section. The AFM tip force can be increased to 15 µN without creating immediate noticeable change in the AFM image. However, at 19 µN force, the silicon tip will remove the chrome line during scanning. This indicates that in tapping mode, where the AFM tip force can be over four orders of magnitude smaller than the damage threshold, both the Nano-CD and silicon probe tip should have a lifetime that is at least four orders of magnitude longer than that at the damage threshold (although the exact relation between the wear and the force is unknown). High data retrieval rates may be obtained by using arrays of scanning probe tips operating in parallel.

In one embodiment, another method of reading the data is to use a near field probe. A near field probe is a special type of optical tip with sub 100 nanometer resolution. In one embodiment, the data can also be read by using a capacitance probe. In such an embodiment, different spacing gives different capacitances. Other embodiments are possible without departing from the present system.

We claim:

1. A method for making a device storing or replicating high density data, the method comprising the steps of:

providing a mold having a patterned molding surface, the pattern comprising features of minimum size less than 50 nanometers across the molding surface for imprinting a data pattern having a storage density of at least about 400 Gbit/in$^2$ for either (a) storing data or (b) replicating data;

providing a body including a surface to be molded;

imprinting the molding surface pattern on the surface to be molded by heating the surface of the body being molded and pressing the mold and the body together;

cooling the imprinted surface; and removing the mold.

2. The method of claim 1 wherein the pattern comprises features of minimum size 13 nm or less.

3. The method of claim 1 wherein the pattern is a circular pattern.

* * * * *